United States Patent [19]

Arii

[11] Patent Number: 4,633,804
[45] Date of Patent: Jan. 6, 1987

[54] SPINNER AND METHOD FOR PROCESSING A SUBSTRATE

[75] Inventor: Katsuyuki Arii, Tama, Japan

[73] Assignee: Fujitsu Limited, Kanagawa, Japan

[21] Appl. No.: 707,766

[22] Filed: Mar. 4, 1985

[30] Foreign Application Priority Data

Mar. 6, 1984 [JP] Japan .................................. 59-042612

[51] Int. Cl.$^4$ ........................ B05C 13/02; B05C 11/02
[52] U.S. Cl. ........................................ 118/52; 118/57; 118/501
[58] Field of Search ...................... 118/52, 57, 54, 501, 118/50 D; 427/240, 241, 346, 347

[56] References Cited

U.S. PATENT DOCUMENTS 3,791,342  2/1974  Boyer et al. ............................ 118/52
4,124,411  11/1978  Meuleman et al. ............. 427/240 X Primary Examiner—John P. McIntosh
Attorney, Agent, or Firm—Armstrong, Nikaido, Marmelstein & Kubovcik

[57] ABSTRACT

A spinner mainly used for spinning treatment of a semiconductor wafer, having a means for generating supersonic power to be transmitted to a supersonic vibration transducer embedded inside a spinning disk so that the supersonic vibration is applied to a processing liquid material dispensed on a work piece held on the center portion of the rotating spinning disk. As a result, particles or air bubbles of small size involved in the layer of liquid material are effectively removed from the liquid layer, resulting in improving fabrication yield and reliability of the product.

2 Claims, 4 Drawing Figures

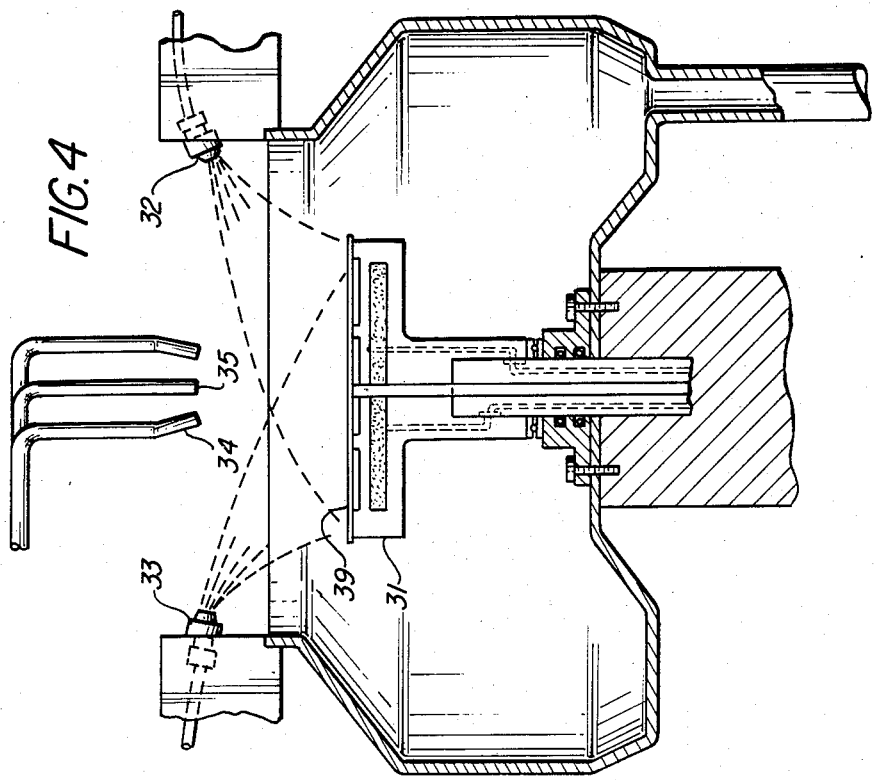

SPINNER AND METHOD FOR PROCESSING A SUBSTRATE

BACKGROUND OF THE INVENTION

This invention relates to a spinner for manufacturing an integrated circuit (IC) device. Particularly it relates to a spinner being capable of removing minute different material particles attached to the surface of a wafer or air bubbles involved in a photoresist layer.

The semiconductor wafers are treated with various processing, during their fabrication, such as a photoresist film formation thereon, developing process of the photoresist layer exposed selectively to ultraviolet light, an etching of silicon oxide layer formed thereon, washing and cleaning to discharge residual treating liquids used, and the like. Recently, the pattern size formed on a semiconductor wafer becomes increasingly fine such as less than one micron to achieve a high packing density on IC substrates. Therefore, it is extremely important to keep the wafers free from defects of micro size, namely in 0.1 micron meter order, such as undesired different particles, dusts, air bubbles in a photoresist films, and so on. These processes are frequently performed in sequential, being desirable to be performed in a single work station without any physical conveyance from station to station. This is because it is very difficult to keep a workpiece away from tiny dusts during the conveyance. In addition, a processing liquid such as etchant used is not permitted to leave any residue on the work piece after the processing.

A spinning method is widely used in semiconductor wafer process to satisfy the above requirements. Particularly, the spinning method contributes to adopt an automated production line for semiconductor devices, because a number of consecutive processes are performed in one spinning work station with several nozzles for respective processing liquids, and the total number of the fabrication steps is reduced.

Furthermore, for a photoresist film formation, the spinning coating is substantially suitable to achieve an even film thickness coated over the wafer with accurate thickness, because the film thickness is relatively easily controlled by controlling the viscosity of photoresist solvent, rotating speed, dispensing speed of the solvent and so on.

The spinner used in a semiconductor device manufacturing, generally, comprises a spinning disk, a spindle, a cup disposed around the rotating disk, and nozzles for dispensing different processing liquids onto the center of the disk sequentially. A workpiece is mounted on the spinning disk, being held by a vacuum chuck or other chucking means and caused to spin at a high speed with the spinning disk, while a liquid chemical to be applied, such as a photoresist solvent, liquid developer, etching liquids, cleaning deionized water, etc., is dispensed onto the workpiece by means of respective nozzles. As a result, the liquid chemical is broadcasted on the surface of the workpiece, to form a layer with thin and uniform thickness by a strong centrifugal force coursed by the high speed spinning.

Tiny particles or alien materials left on the surface of the workpiece or air bubbles of micro size involved in a photoresist layer, causes a serious problem in modern IC devices such as a breakdown or shortage of the circuit formed in the device. In order to eliminate the drawbacks, various methods are adopted to eliminate such micro-particles from associated processing agents. For example, necessary chemicals are purchased under severe specifications for alien material particles mixed therein. The fabrication activity is performed under a strict dust-proof control. Furthermore, fine filters are used to filter the chemical liquids in the fabrication steps. However, since the allowable maximum size of mixed particles of foreign materials or air bubbles is becoming small below one micron, there is a limitation to overcome the problem using the prior art methods described above.

SUMMARY OF THE INVENTION

It is an object of the present invention to provide a spinner, effectively reducing or eliminating particles in chemical liquids, or air bubbles involved in photoresist layers formed on a wafer during fabrication steps of a semiconductor device.

It is another object of the present invention to activate the chemical reaction of chemicals such as a developing liquid.

It is a further object of the present invention to provide a spinner by which the fabrication yield of semiconductor wafers can be elevated.

These object are achieved by applying a supersonic energy to the chemical liquid, dispensed on the spinning workpiece held on a spinning disk. The supersonic energy is applied to the chemical liquid in the form of a vibration, being converted by a supersonic vibration transducer embedded in a spinning disk. The supersonic energy is generated by a supersonic power source and fed to the supersonic vibration transducer through feeding lines and couplers. The frequency suitable for the purpose is found to be from 100 KHz to 2000 KHz. For example, approximately 1000 KHz or the like are found most effective for removing small bubbles contained in an ordinary photoresist layer.

The applications of supersonic energy to water cleaning or chemical liquid treatment of workpieces are well known technology widely used, being found effective to eliminate tiny particles attached to the workpieces to be cleaned. The currently used frequency of the supersonic energy is 20 to 40 KHz, rarely to 80 KHz, mainly because of less decay of the supersonic energy ejected into the processing liquid in the above frequency range. Although, with an increase in the frequency of the supersonic energy travelling in a medium, such as water, the energy increases proportional to the square of the frequency. On the other hand, the decay and directivity of the energy in the medium, remarkably increase with the frequency.

However, in a spinning operation of a semiconductor wafer, for example, the thickness of the chemical liquid is very thin. This is because the liquid is broadcasted towards the peripheral of the wafer by a strong centrifugal force generated by the high speed rotation. The supersonic energy are applied in the direction perpendicular to the layer, resulting in a very small travelling path equal to the thickness of the layer. Therefore, the decay and the directivity of the supersonic energy are not necessary to be considered. Thus a supersonic vibration of a higher frequency is applicable to the spinner operation. The most typical and effective application of the present invention is that to a photoresist layer formation on a semiconductor wafer. With a photoresist material having considerably high viscosity from 70 cp to 100 cp, it is difficult to remove the air bubbles involved in the photoresist layer using a prior art spinning method. According to the present invention, a disk type supersonic vibration transducer of PZT (a solid solution of $PbTiO_3$—$PbZrO_3$) is embedded in a spinning disk of an insulative material such as ceramic, having a rotating spindle to which a driving motor is coupled to rotate the disk at high rotation speed. A pair of power feeding lines introduces a supersonic power from a supersonic power generator through an electric ring coupler. The frequency is selected from 200 KHz to 2000 KHz depending on the size and character of the chemicals used, materials of the layer and particles to be removed. For example, the frequency of approximately 1000 KHz is most effective to eliminate micro bubbles involved in the photoresist layer. In an earlier stage of the spinning operation, whereby the photoresist is dispensed on a work piece, being followed by a relatively slow spinning, forming a relatively thick photoresist layer, the supersonic power is applied to the transducer. By the application of the supersonic energy, most of small bubbles and small particles trapped by the surface of the wafer, are peeled off from the surface to float into the medium and broadcast to the peripheral of the wafer to be drained together with an excess photoresist. After that, the rotating speed is increased to increase the centrifugal force in the layer, whereby, a hot nitrogen is introduced to dry the photoresist layer. One experimental result is described to ensure the effect of of the applied supersonic power.

In addition, a chemical action such as developing, chemical etching, chemical cleaning, and the like, are remarkably accelerated by the vibration occurring in the direction of the axis of the supersonic vibration transducer and a satisfactory reaction between chemicals and the workpiece is performed in a short time.

These objects and advantages which will be subsequently apparent, reside in the details of construction and operation as more fully hereinafter described and claimed, with reference to the accompanying drawings, wherein like reference letters refer to like parts throughout.

BRIEF DESCRIPTION OF THE DRAWINGS

FIG. 4 is a cross-sectional view of another embodiment for developing the pattern of a photoresist layer exposed to an ultra-violet light.

DESCRIPTION OF THE PREFERRED EMBODIMENT

As typical embodiments, a photoresist formation process on a semiconductor wafer and a development process of a photoresist layer are described.

Figure 1:
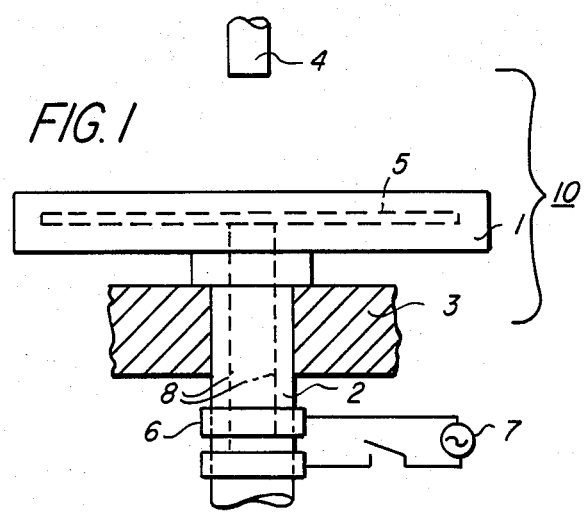
FIG. 1 is a general view of a spinner and associated apparatus according to the present invention, illustrating the whole system.

FIG. 1 is a general view of a supersonic spinner illustrating the composition of the spinner and associated equipment. A rotating head block 10 comprises a ceramic disk 1 and a supersonic vibration transducer disk 5 of PZT (shown with dotted line) embedded in the ceramic disk 1. The head block 10 is mounted on a rotating spindle 2 of ceramic in a manner to be detachable from or attachable to the rotating spindle 2, which is held rotatably by a bearing means 3. Supersonic power generated in a supersonic power generator 7 is fed to the supersonic vibration transducer disk 5 through a ring coupler 6 and feeder (copper wires) 8 and applied to terminals (not shown) of the supersonic vibration transducer 5. Hereby, the power is converted to a vibration energy which is applied to the liquid layer. The frequency of the supersonic power is selected depending on the material and dimension of the workpiece. Accordingly, a supersonic power of variable frequency is more desirable to respond various requirement for production. The maximum rotating speed is selected approximately 5000 rpm.

A general operation of a spinner is described below referring to FIG. 1. When a chemical liquid is applied to the center of the spinning disk through a nozzle 4, the liquid spread over the workpiece. With the application of supersonic power to the transducer disk 5, the micro size particles, contained originally in the chemicals or adhered to the surface of the workpiece, are promoted to go upward, or peeled off from the surface of the workpiece by the upward component of the applied supersonic vibration. Then the spinning head 10 rotates faster, and the chemical liquids (photoresist layer for example) runs toward the peripheral of the disk. Thus, the particles or air bubbles are broadcast to the peripheral region of the spinning disk, being disposed into a cup (not shown, in FIG. 1, see FIG. 2 or FIG. 4) mixed with a wasted chemical materials to be drained.

The inventors has found that when a supersonic power of low frequencies such as from 20 KHz to 80 KHz is applied, the surface of the wafer tend to be destroyed or "eroded" to create fine cracks, which might be ascribed to "cavitation" phenomena. The high energy generated at the collapse of the cavitation bubbles is too strong to protect the surface of the wafer from the destruction. On the other hand, although the travelling path of the supersonic wave in the medium layer is short, there is a limit of the propagation of the supersonic wave due to the absorption or decay of the wave of high frequency. Thus the useful frequency range of the supersonic wave in a spinning operation, is limited from 100 KHz to 2000 KHz.

Figure 2:
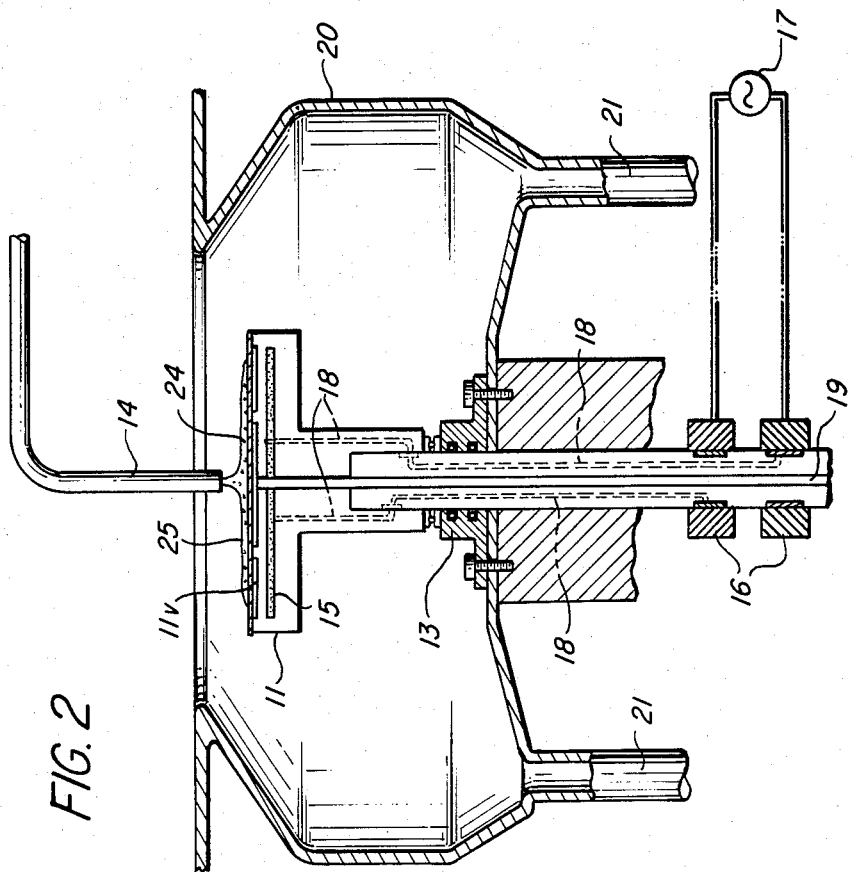
FIG. 2 is a cross-sectional view of an embodiment used for photoresist layer formation.

FIG. 2 is a schematic cross-sectional view of a spinner by the present invention for photoresist layer coating. Similar to the spinner of FIG. 1, a spinning disk 11, containing a supersonic vibration transducer disk 15 of PZT, is supported rotatably by a complex thrust and journal bearing 13, and driven by a motor (not shown). A liquid material such as photoresist liquid may be applied through a nozzle 14 to the center of the spinning disk 11 as shown in FIG. 2. The surface of the spinning disk 11 has a vacuum chuck 11v to hold a workpiece on the surface. The evacuation for the vacuum chuck 11v is performed through a hole 19 by a conventional rotating vacuum pump (not shown). The supersonic power from the supersonic power generator 17 is fed to the terminals (not shown) of the supersonic vibration transducer through copper conductors 18 and couplers 16. To prevent the radially broadcast liquid chemicals from being sprayed around, a cup assembly 20 is disposed around the spinning disk. Reference numeral 21 denotes a drainage tube for drain liquids used.

Figure 3:
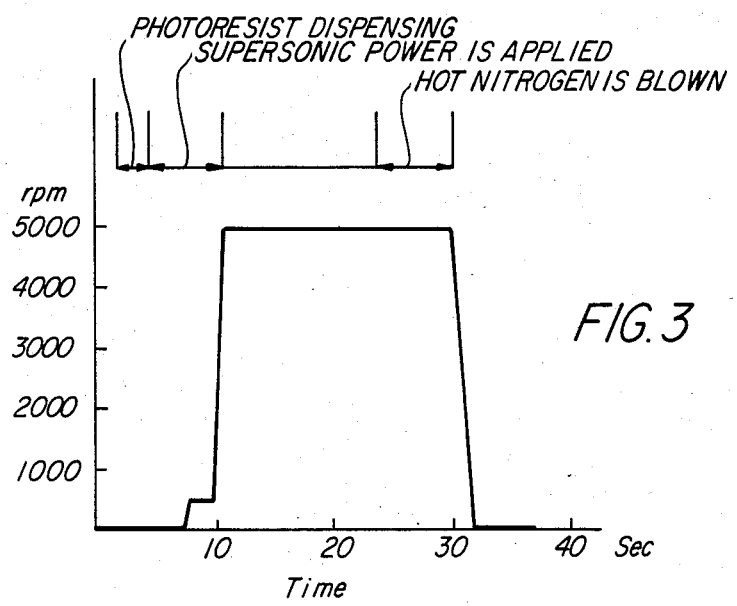
FIG. 3 is a time chart of the application of a supersonic power to a photoresist layer in conjunction with rotating speed of the spinning disk during a photoresist layer formation process.

A photoresist coating process is described below. A photoresist liquid 24, having a high viscosity, 70 cp to 150 cp, is dispensed through the nozzle 14 onto the central portion of a wafer 25 held on the surface of a spinning disk 11 by a vacuum chuck 11v. As shown in a time chart of FIG. 3, a supersonic power is applied before starting the rotation of the spinning disk 11, and kept applied at the earlier stage of the rotation where the rotating speed is low, approximately 500 rpm. The air bubbles of micro size involved in the layer during the dispensing or preceding fabrication steps, especially bubbles trapped on the surface of the wafer, are released and float into the photoresist layer by the supersonic power. The floating bubbles and particles are transported together with the excessive photoresist to the peripheral of the spinning disk 11 and finally drained into the cup assembly 20. Then the spinning disk 11 accelerated to 5000 rpm and a hot nitrogen gas is introduced to solidify the photoresist layer. If the surface of the wafer sustains a lot of dust particles, it is effective to remove the dust particles, in advance, by dispensing deionized water or cleaning chemicals onto the wafer to clean up before the photoresist coating starts.

As another application of the present invention, a developing process of a coated photoresist film is described referring to FIG. 4. After exposing a masked wafer 39 coated with a photoresist layer to an ultraviolet light to fix a pattern of the mask, the wafer 39 is held on a spinning disk 31 by the aid of vacuum chuck, and developing solution is sprayed from two nozzles 32 and 33, located on the side wall of a cup assembly as shown in FIG. 4. In this case, the supersonic power provide an impact in the vertical direction, exciting the chemical reaction between developing solution and the photoresist material not exposed to the ultraviolet light. As a result, a sharply patterned photoresist layer is obtained in a shorter developing time. In addition, particles of micro size and small air bubbles are removed substantially from the wafer 39, improving the quality of the wafer 39. The developing process is followed by a rinsing process with deionized water, and a hot air drying process of the patterned photoresist layer on the wafer 39. The deionized water and the hot air are introduced respectively in sequence onto the wafer 39 through nozzles 34 and 35 located above the spinning disk 31.

As is apparent to those skilled in the art, the timing of the application of the supersonic power must be determined depending on the material of the workpieces, aspects of the workpiece, etc., and the present invention is not confined to the case described in above embodiments.

Finally, an experimental result obtained by the inventor is described. With this experiment, a supersonic power having an approximately 600 KHz frequency is applied. A supersonic vibration transducer used is 2 mm in thickness and has a lining of aluminum of 4 mm in thickness. The spinning disk head block is approximately 200 mm in diameter. The experiment is conducted using a glass plate of 5 inches square, with a chromium layer of 600 Å thickness deposited thereon to form a probe. A photoresist material used is OFPR-800 produced by the TOKYO OOKA-KAGAKU Co. On the glass plate, 10 cc of the photoresist solution with a viscosity of 8 cp is dropped. After the spread of the photoresist material all over the surface of the glass plate, a supersonic vibration is applied to the glass plate for approximately 5 sec using a supersonic vibration transducer of 100 W output, being followed by the application of a spinning of approximately 3000 rpm for 30 sec, to spread away the excessive photoresist material. As a result, a satisfactorily uniform photoresist layer is obtained. The layer is dried by a pre-baking at approximately 90° C. for 90 to 30 sec. Without the application of the supersonic power to the probe, another group of probes is prepared with a similar process to that of the preceding probes. A careful observation is conducted on the two groups of the glass plates to examine the numbers of particles and bubbles left on the probes. The supersonic power is applied to experimental probes of the one group as described above, and not applied to probes of the another group. The observation is performed with naked eyes using a lamp (day-light with 10,000 Lux) having a safety filter against ultraviolet light to prevent the further photo-sensitive reaction. The results are tabulated as follows:

|  | supersonic energy | |
| --- | --- | --- |
| checking level | applied | not applied |
| no defect | 97 | 73 |
| more than 10 pieces of 1~5 μm particles | 2 | 19 |
| more than 1 piece of >6 μm particles | 1 | 4 |
| pin hole found | 0 | 4 |
| total number | 100 | 100 |

The experimental results indicate clearly that the application of the supersonic power to a spinning process is very effective to remove particles and air bubbles of small size from the photoresist layer. Especially, it is a significant advantage of the present invention from the view point of the fabrication that no pin hole was found in the pre-baked photoresist layer.

What is claimed is as follows:

1. A spinner for use in processing of semiconductor substrates and the like, comprising:
    spinning disk means for holding a workpiece thereon, said spinning disk means being rotatable at a specified rotating speed;
    dispensing means for dispensing process liquid material onto a workpiece held on said spinning disk means;
    supersonic power generating means;
    supersonic vibration transducer means embedded in said spinning disk means; and
    conducting means operably connecting said supersonic power generating means and said supersonic vibration transducer means for supplying supersonic power generated by said supersonic power generating means to said supersonic vibration transducer means for causing said supersonic vibration transducer means to vibrate supersonically, whereby supersonic vibrations are applied to said liquid process material dispensed onto said workpiece held on said spinning disk means.

2. A spinner in accordance with claim 1, wherein the frequency of said supersonic power generated by said supersonic power generating means is selected to be in the range from 100 KHZ to 2,000 KHZ.

* * * * *